United States Patent
Dhindsa et al.

(10) Patent No.: US 10,720,314 B2
(45) Date of Patent: *Jul. 21, 2020

(54) CONFINEMENT RING FOR USE IN A PLASMA PROCESSING SYSTEM

(71) Applicant: Lam Research Corporation, Fremont, CA (US)

(72) Inventors: Rajinder Dhindsa, San Jose, CA (US); Akira Koshiishi, Fremont, CA (US); Alexei Marakhatanov, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 249 days.

This patent is subject to a terminal disclaimer.

(21) Appl. No.: 15/669,742

(22) Filed: Aug. 4, 2017

(65) Prior Publication Data
US 2017/0330735 A1   Nov. 16, 2017

Related U.S. Application Data

(63) Continuation of application No. 12/872,984, filed on Aug. 31, 2010, now Pat. No. 9,779,916.
(Continued)

(51) Int. Cl.
*H01J 37/32*   (2006.01)

(52) U.S. Cl.
CPC .. *H01J 37/32807* (2013.01); *H01J 37/32082* (2013.01); *H01J 37/32091* (2013.01);
(Continued)

(58) Field of Classification Search
None
See application file for complete search history.

(56) References Cited

U.S. PATENT DOCUMENTS

| | | | |
|---|---|---|---|
| 5,209,803 A | 5/1993 | Powell | 156/345 |
| 5,242,539 A | 9/1993 | Kumihashi et al. | 156/643 |

(Continued)

FOREIGN PATENT DOCUMENTS

| | | | | |
|---|---|---|---|---|
| JP | H1041096 A | 2/1998 | | C23C 16/44 |
| JP | 2000-100789 A | 4/2000 | | C23C 16/50 |

(Continued)

OTHER PUBLICATIONS

Korean Office Action, 10-2017-7031995, dated Feb. 2, 2018, Ref. 9-5-2018008472455.
(Continued)

*Primary Examiner* — Sylvia MacArthur
(74) *Attorney, Agent, or Firm* — Penilla IP, APC

(57) ABSTRACT

An apparatus for confining plasma within a plasma processing chamber is provided. The plasma processing chamber includes a lower electrode for supporting a substrate and an upper electrode disposed over the lower electrode. The apparatus is a confinement ring that includes a lower horizontal section extending between an inner lower radius and an outer radius of the confinement ring. The lower horizontal section includes an extension section that bends vertically downward at the inner lower radius, and the lower horizontal section further includes a plurality of slots. The confinement ring further includes an upper horizontal section extending between an inner upper radius and the outer radius of the confinement ring and a vertical section that integrally connects the lower horizontal section with the upper horizontal section. The extension section of the lower horizontal section is configured to surround the lower electrode when installed in the plasma processing chamber.

22 Claims, 8 Drawing Sheets

Related U.S. Application Data

(60) Provisional application No. 61/238,670, filed on Aug. 31, 2009.

(52) U.S. Cl.
CPC .. *H01J 37/32174* (2013.01); *H01J 37/32577* (2013.01); *H01J 37/32642* (2013.01)

(56) References Cited

U.S. PATENT DOCUMENTS

| | | | | |
|---|---|---|---|---|
| 5,389,197 | A | 2/1995 | Ishimaru | 156/643 |
| 5,523,261 | A | 6/1996 | Sandhu | 437/228 |
| 5,525,159 | A | 6/1996 | Hama et al. | 118/723 I |
| 5,779,803 | A | 7/1998 | Kurono et al. | 118/723 R |
| 5,916,454 | A | 6/1999 | Richardson et al. | 216/67 |
| 6,156,151 | A | 12/2000 | Komino et al. | 156/345 |
| 8,826,855 | B2 * | 9/2014 | Kellogg | H01J 37/32091 118/723 E |
| 9,779,916 | B2 * | 10/2017 | Dhindsa | H01J 37/32082 |
| 2004/0159286 | A1 | 8/2004 | Aoki et al. | 118/723 E |
| 2007/0158027 | A1 | 7/2007 | Aoki et al. | 156/345.43 |
| 2017/0330735 | A1 * | 11/2017 | Dhindsa | H01J 37/32082 |

FOREIGN PATENT DOCUMENTS

| | | | |
|---|---|---|---|
| JP | 2001-203189 A | 7/2001 | H01L 21/205 |
| KR | 1020080025690 | 3/2008 | H01L 21/3065 |

OTHER PUBLICATIONS

Korean App. No. 10-2018-7012209, Notification of the Final Rejection, Korean Intellectual Property Office, dated Jul. 24, 2019 (Korean language), and dated Aug. 23, 2019 (English translation).

* cited by examiner

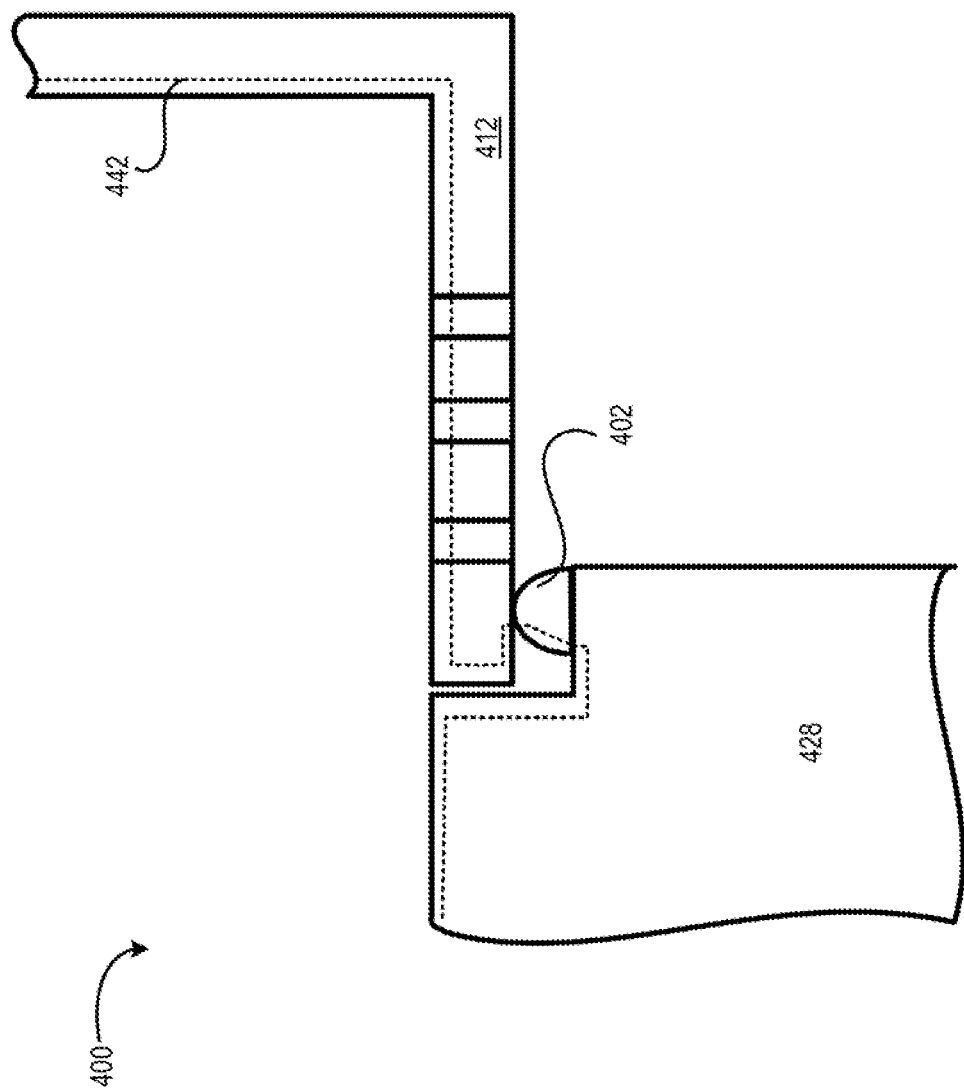

US 10,720,314 B2

CONFINEMENT RING FOR USE IN A PLASMA PROCESSING SYSTEM

PRIORITY CLAIM

This application is a continuation of U.S. patent application Ser. No. 12/872,984, filed on Aug. 31, 2010, entitled "RADIO FREQUENCY (RF) GROUND RETURN ARRANGEMENTS", which claims priority to U.S. Provisional Patent Application No. 61/238,670, filed on Aug. 31, 2009, entitled "RADIO FREQUENCY (RF) GROUND RETURN ARRANGEMENTS," which are herein incorporated by reference.

BACKGROUND

Advances in plasma processing have provided for growth in the semiconductor industry. In today competitive market, a manufacturing company needs to be able to minimize waste and produce high quality semiconductor devices. During substrate processing, conditions of the chamber may impact substrate processing. A critical parameter that may affect the plasma processing of substrates is the flow of the radio frequency (RF) current.

To facilitate discussion, FIG. 1 shows a simple block diagram of a capacitively-coupled plasma processing system with a processing chamber 100. Consider the situation wherein, for example, a substrate 106 is being processed within processing chamber 100. To ignite the plasma for etching substrate 106, a gas may interact with an RF current. The current may flow from an RF supply 122 along a cable 124 through an RF match 120 into processing chamber 100 during substrate processing. The RF current may travel along a path 140 to couple with the gas reactant to create plasma within a confined chamber volume 110 for processing substrate 106, which is positioned above a bottom electrode 104.

In order to control plasma formation and to protect the processing chamber walls, a set of confinement rings 112 may be employed. Set of confinement rings 112 may be made of a conductive material such as silicon, polysilicon, silicon carbide, boron carbide, ceramic, aluminum, and the like. Usually, set of confinement rings 112 may be configured to surround the periphery of confined chamber volume 110 in which a plasma is to form. In addition to set of confinement rings 112, the periphery of confined chamber volume 110 may also be defined by upper electrode 102, bottom electrode 104, insulator rings 116 and 118, an edge ring 114 and a lower electrode support structure 128.

In order to exhaust the neutral gas species from the confinement region (confined chamber volume 110), set of confinement rings 112 may include a plurality of slots (such as slots 126a, 126b, and 126c). The neutral gas species may traverse from confined chamber volume 110 into an external region 132 (outside chamber volume) of processing chamber 100 before being pumped out of processing chamber 100 via a turbo pump 134.

Those skilled in the arts are aware that unconfined plasma may cause an unstable processing environment. Ideally, the plasma formed during substrate processing is formed within confined chamber volume 110. However, under certain conditions, plasma may be ignited outside of confined chamber volume 110. In an example, given a high pressurized environment, the neutral gas species (which are being exhausted from confined chamber volume 110 into external region 132 of processing chamber 100) may encounter an RF field/magnetic field. The existence of RF current in the outside chamber may cause the formation of unconfined plasma 150.

In a typical processing environment, the RF current flows from RF generator into confined chamber volume 110. Those skilled in the arts are aware that RF current flowing into processing chamber 100 usually tries to return to its RF source. In a typical prior art configuration, a RF return path 142 may include the RF return current flowing along the inside of set of confinement rings 112. At point 152, the RF return current may flow along the outside of confinement rings 112 to bridge with the inside wall surface of processing chamber 100. From the chamber wall, the RF return current may follow a set of straps 130 to lower electrode support structure 128. From the surface of lower electrode support structure 128, the RF return current may flow back to RF source 122 via RF match 120.

As can be seen from the foregoing, by following path 142, the RF current flows outside of confined chamber volume 110 on its way back to RF source 122. As a result, a magnetic field or a RF field may be generated in the outside chamber region. The existence of an RF field/magnetic field may cause unconfined plasma 150 to be formed in external region 132 of processing chamber 100.

Since RF return current tends to seek a low impedance path, a set of straps may be employed to provide a low impedance path, thereby creating a shorter RF return path than path 142 (that follows the chamber wall), as shown in FIG. 2. In an example, a set of straps 230 may be employed to couple a confinement ring 212 to a lower electrode support structure 228 within a processing chamber 200. Thus, when the RF return current (flowing along a path 242) flows along the bottom side of outer wall of confinement ring 212, the RF return current may encounter a set of straps 230. Since the set of straps 230 provide a lower impedance path than the outer surface of confinement ring 212, the RF return current may bridge to lower electrode support structure 228 via set of straps 230. From lower electrode support structure 228, the RF return current may continue onward to a RF source 222 via a RF match 220.

As can be appreciated from the foregoing, the RF return current path 242 is significantly shorter than path 142 of FIG. 1. However, a magnetic field/RF field may be formed in a region 244 between set of straps 230 and confinement ring 212. As a result, plasma may be ignited outside of the confined chamber volume (within region 244) given the right condition (such as the existence of gas reactants, a sufficiently high pressure volume, and an RF field/magnetic field).

Accordingly, an arrangement for providing a short RF return path while preventing the ignition of unconfined plasma is desirable.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements and in which:

FIGS. 4, 5, 6, and 7 show, in embodiments of the invention, RF ground return arrangements for an adjustable-gap processing chamber.

DETAILED DESCRIPTION OF EMBODIMENTS

Figure 1:
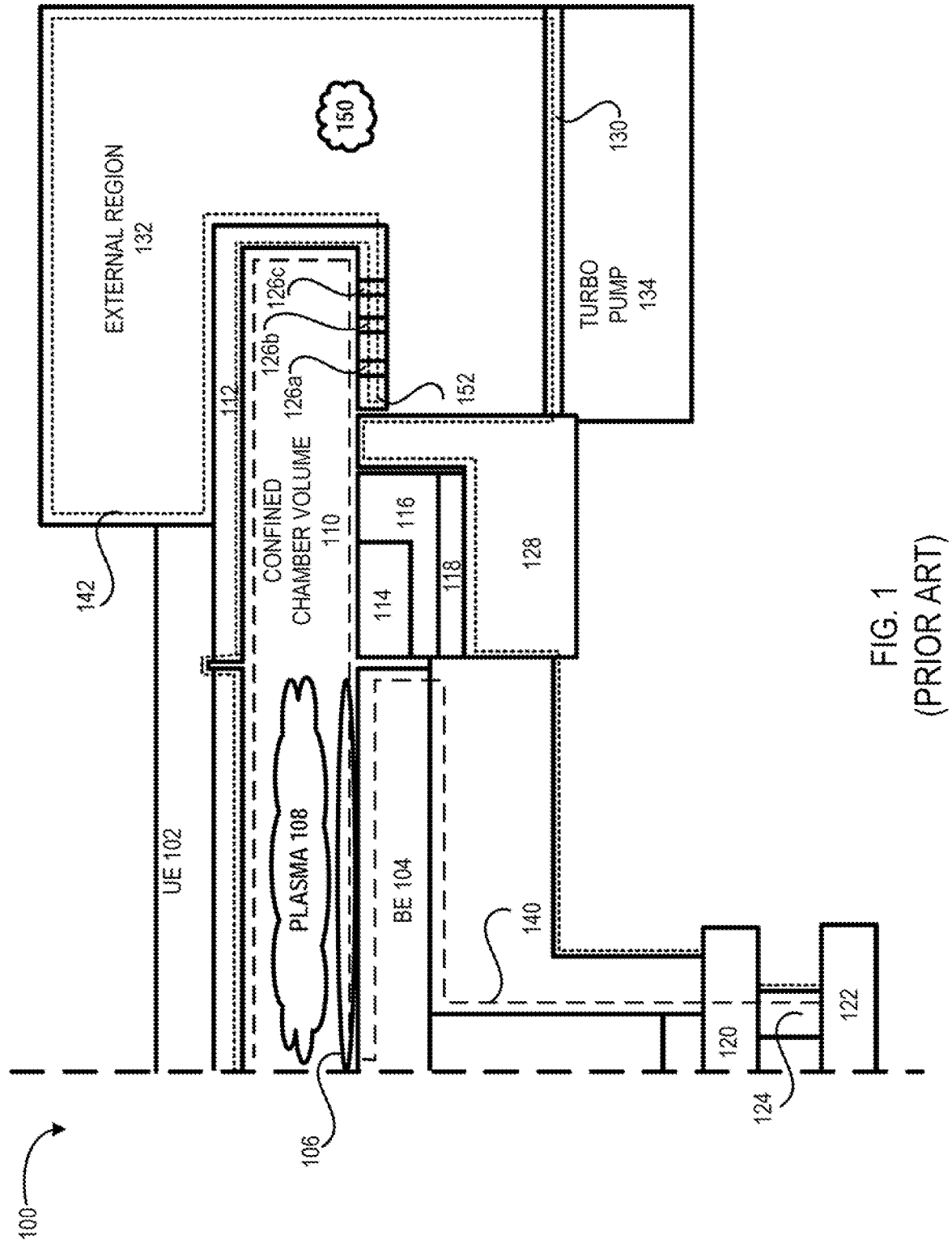
FIG. 1 shows a simple block diagram of a capacitively-coupled plasma processing system with a processing chamber.
Figure 2:
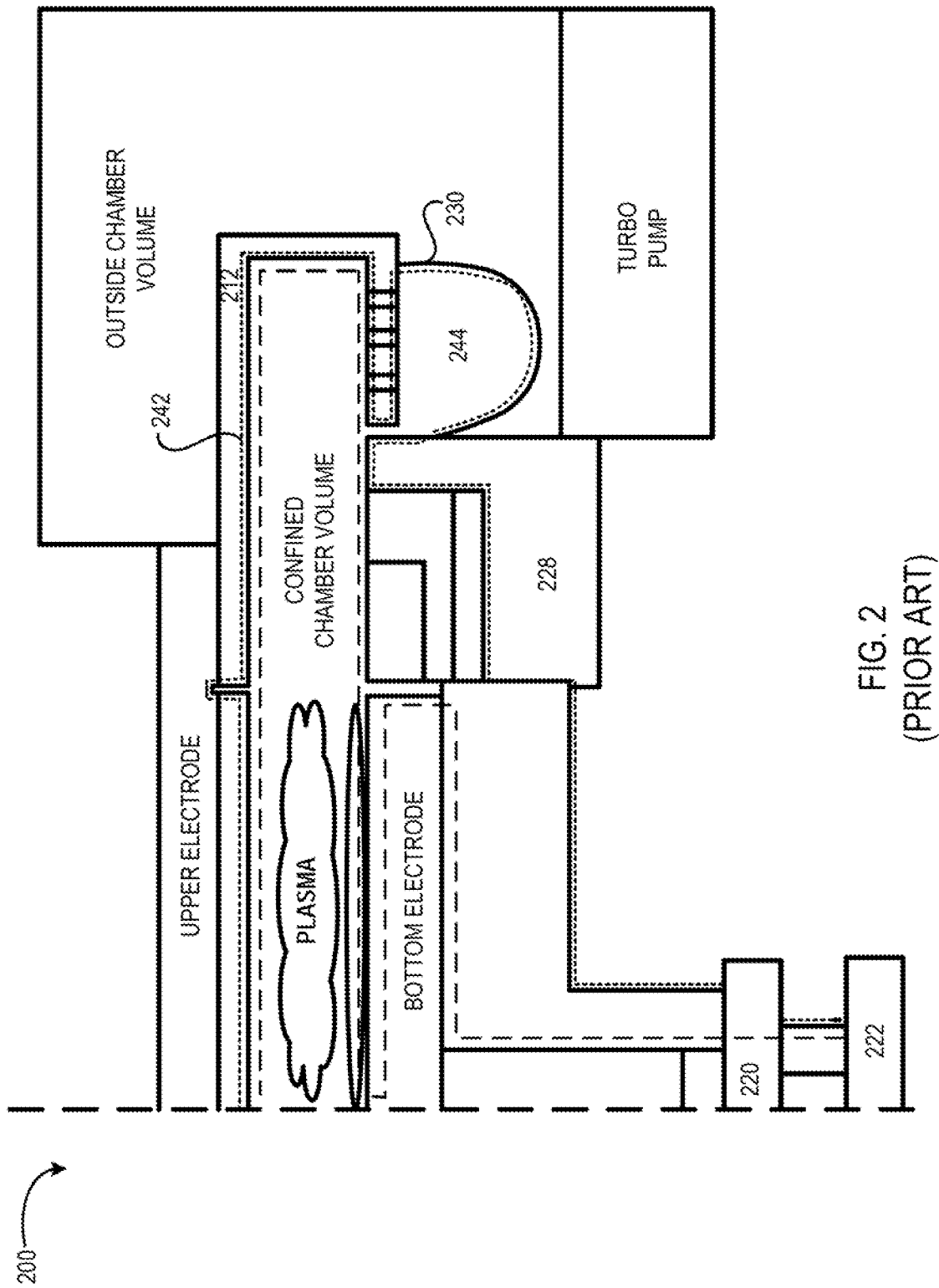
FIG. 2 shows a simple block diagram of a processing chamber with a strap-driven RF return path.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

In one embodiment, an apparatus for confining plasma within a plasma processing chamber is provided. The plasma processing chamber includes a lower electrode for supporting a substrate and an upper electrode disposed over the lower electrode. The apparatus is a confinement ring that includes a lower horizontal section extending between an inner lower radius and an outer radius of the confinement ring. The lower horizontal section includes an extension section that bends vertically downward at the inner lower radius, and the lower horizontal section further includes a plurality of slots. The confinement ring further includes an upper horizontal section extending between an inner upper radius and the outer radius of the confinement ring and a vertical section that integrally connects the lower horizontal section with the upper horizontal section. The extension section of the lower horizontal section is configured to surround the lower electrode when installed in the plasma processing chamber.

In accordance with embodiments of the present invention, radio frequency (RF) ground return arrangements are provided. Embodiments of the invention include establishing a short RF return path for the RF return current by providing a direct RF contact (via a RF contact-enabled component) between a confinement ring and a lower electrode support structure.

In this document, various implementations may be discussed using a single confinement ring as an example. This invention, however, is not limited to a single confinement ring and may be applied to a plasma processing system with one or more confinement rings. Instead, the discussions are meant as examples and the invention is not limited by the examples presented.

In an embodiment of the invention, RF ground return arrangements are provided for establishing a RF return path back to the RF source while substantially eliminating the possibility of a magnetic field/RF field being established outside of the confinement region (region as defined by the periphery of the confinement ring). In an embodiment, the RF ground return arrangements may be implemented within a capacitively-coupled plasma (CCP) processing system. The RF ground return arrangements may be implemented within a processing chamber with a fixed or movable lower electrode support structure, in an embodiment.

In one embodiment of the invention, a RF ground return arrangement may be implemented with a RF gasket. The RF gasket may be made of a conductive material. In an embodiment, the RF gasket is in electrical contact with the confinement ring and a lower electrode support structure (such as a ground ring).

For a processing chamber with a fixed lower electrode support structure, the RF gasket may be relatively small and may be either compliant or non-compliant. However, in processing chamber with a movable lower electrode support structure, the RF gasket is configured to have a shape and dimension to accommodate the movement of the ground ring as the lower electrode support structure is moved in a vertical direction. In an embodiment, the shape of the RF gasket is configured to be a large curvature design (for example, an upside-down or a sideway C-shaped flexible conductor RF gasket), thereby enabling the ground ring to maintain RF contact with the confinement ring. In other words, the size of the RF gasket is at least equal to the size of the gap between the bottom-facing surface of the confinement ring and the upper-facing surface of the ground ring. In addition, the RF gasket is compliant, thereby enabling the shape of the RF gasket to change as the ground ring moves. In an example, as the ground ring moves upward (narrowing the gap between the ground ring and the confinement ring), the RF gasket is flattened. However, when the ground ring is at the furthest distance from the confinement ring, the RF gasket may have more of a half-donut shape.

In another embodiment, the RF ground return arrangement may be implemented with a spring-loaded sliding contact arrangement. The spring-loaded sliding contact arrangement may include a spring member coupled to a confinement ring. The spring member is biased toward the wall of a ground ring. In an embodiment, the spring member is in electrical contact with the wall of the ground ring via a contact point. Thus, as the ground ring moves up and down, the ground ring remains in RF contact with the confinement ring via the spring-loaded sliding contact arrangement.

In yet another embodiment, the RF ground return arrangement may include a confinement ring with an extension. The extension may extend downward and is parallel to a side wall of the ground ring. In an embodiment, the extension is positioned at a close proximity to the ground ring, thereby narrowing the gap between the extension and the ground ring. The proximity of the extension to the ground ring creates a large capacitance area. Since impedance is inversely proportional to capacitance, the large capacitance area may create a low impedance return path for the RF return current.

Another RF ground arrangement, in an embodiment, may include a RF conductive rod in electrical contact with a confinement ring and a ground ring. In an embodiment, the RF conductive rod is disposed within a conductive liquid, which resides within a recess area of the ground ring. Thus, when the ground ring moves vertically, a part of the RF conductive rod remains in the conductive liquid of the ground ring. As a result, RF contact is maintained between the confinement ring and the ground ring via the RF conductive rod to provide a low impedance path for the RF return current.

As can be appreciated from the foregoing, the RF ground return arrangements provide shorter RF return paths for the RF return current in comparison to the prior art arrangements. In addition, each RF ground return arrangement does not encapsulate an area that is capable of creating an RF field/magnetic field and sustaining unconfined plasma outside of the confinement region.

The features and advantages of the present invention may be better understood with reference to the figures and discussions that follow.

Figure 3A:
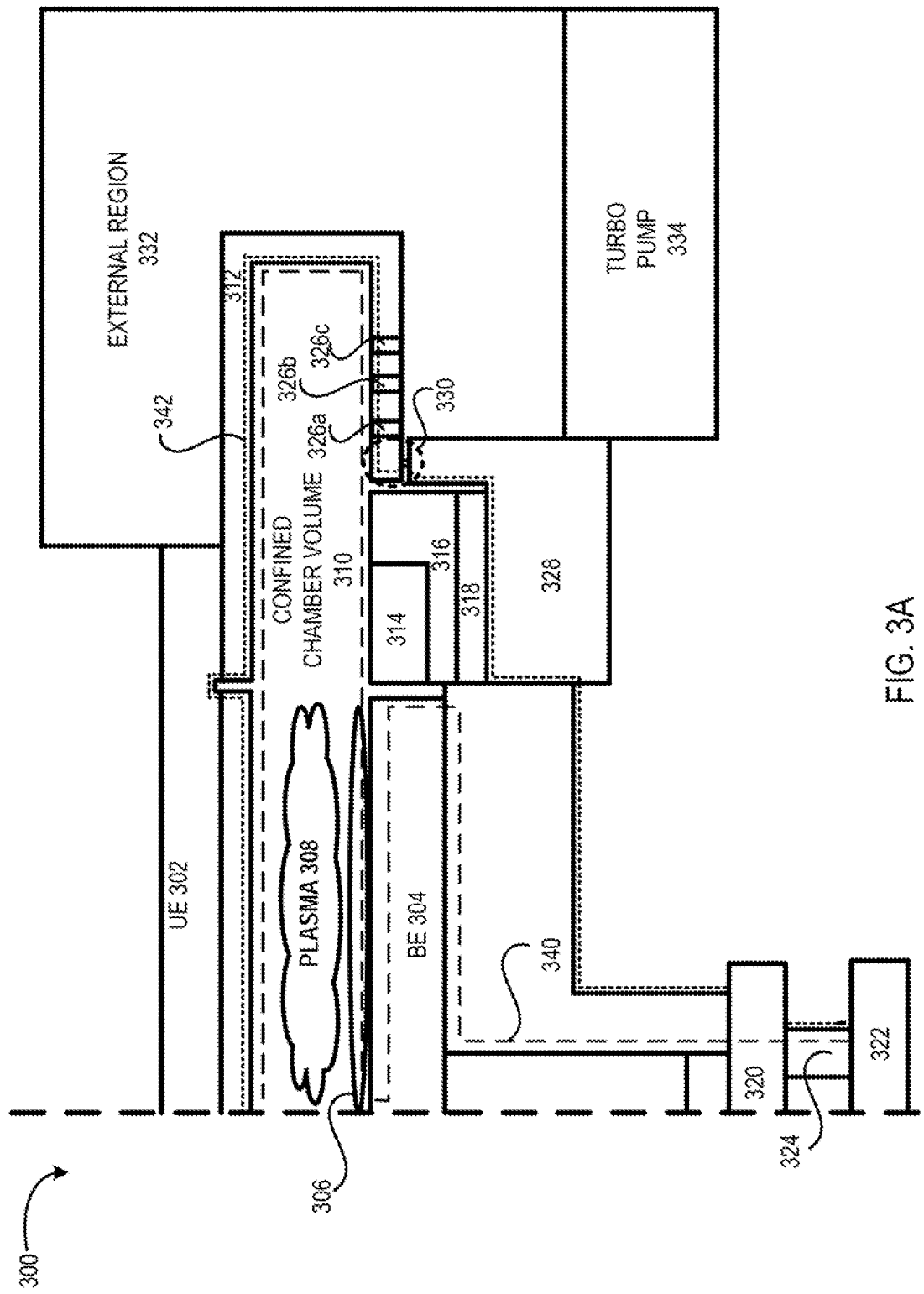
FIGS. 3A and 3B show, in embodiments of the invention, simple diagrams of a RF ground return arrangement.
Figure 3B:
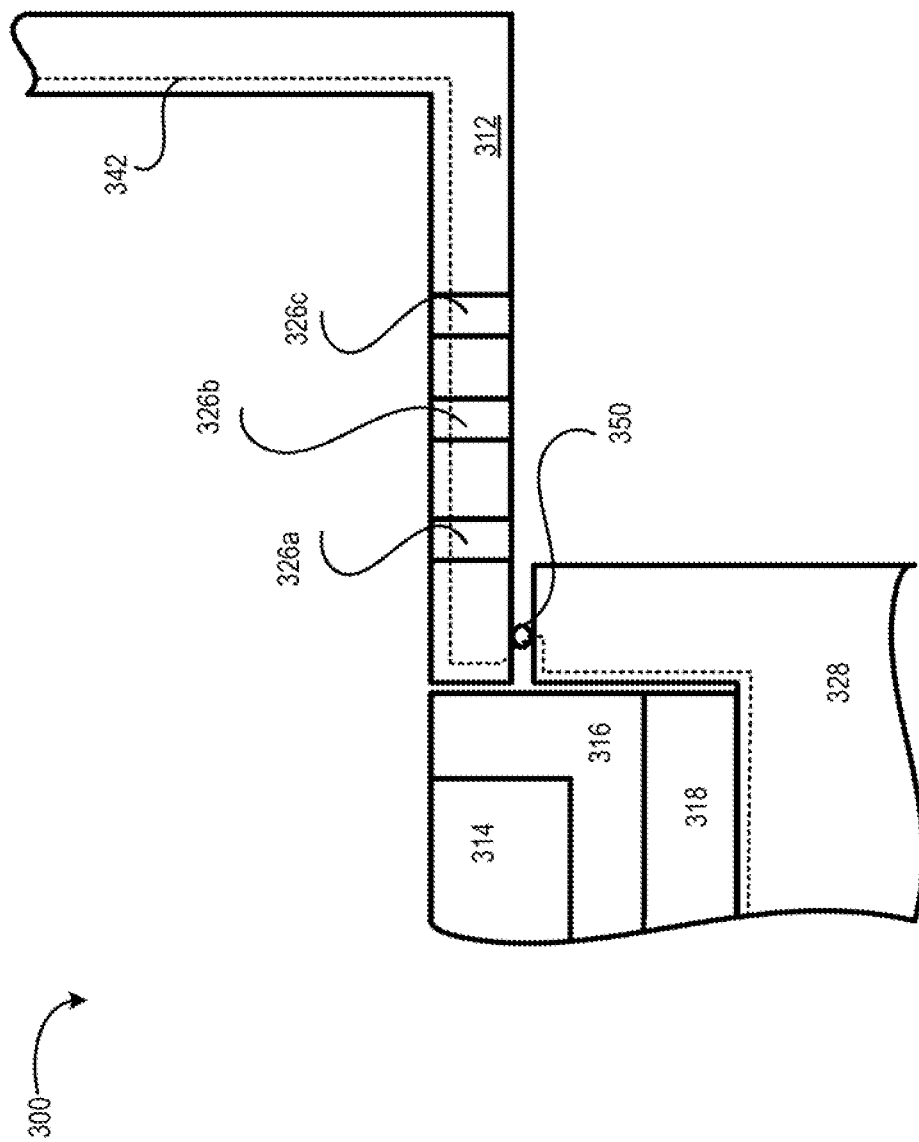

FIGS. 3A and 3B show, in embodiments of the invention, simple diagrams of one example of a RF ground return arrangement. Consider the situation wherein, for example, a substrate 306 is being processed within a processing chamber 300. In an embodiment, processing chamber 300 may be a capacitively-coupled plasma processing chamber. Substrate 306 may be positioned above a bottom electrode 304. During substrate processing, a plasma 308, which may be employed to etch substrate 306, may be formed between substrate 306 and an upper electrode 302.

In order to control plasma formation and to protect the processing chamber walls, a set of confinement rings 312 may be employed. Set of confinement rings 312 may include a plurality of confinement rings or may be one continuous ring. Set of confinement rings 312 may be made of a conductive material such as silicon, polysilicon, silicon carbide, boron carbide, ceramic, aluminum, and the like.

Usually, set of confinement rings 312 may be configured to surround the periphery of a confined chamber volume 310 in which plasma 308 is to form. In addition to set of confinement rings 312, the periphery of confined chamber volume 310 may also be defined by upper electrode 302, bottom electrode 304, insulator rings 316 and 318, an edge ring 314 and a lower electrode support structure 328.

During substrate processing, gas may flow from a gas distribution system (not shown) into confined chamber volume 310 and interact with RF current to create plasma 308. RF current may be flowing from an RF source 322 to an RF match 320 via a cable 324. From RF match 320, the RF current may flow up along a path 340 through bottom electrode 304 to interact with the gas within confined chamber volume 310 to form plasma 308.

In order to exhaust the neutral gas species from the confinement region (confined chamber volume 310), set of confinement rings 312 may include a plurality of slots (such as slots 326a, 326b, and 326c). The number and size of slots on set of confinement rings 312 may vary depending upon the rate of conductance required. The neutral gas species may traverse from confined chamber volume 310 through the slots into an external region 332 (outside chamber volume) of processing chamber 300 before being pumped out of processing chamber 300 via a turbo pump 334.

In the prior art, the existence of an RF field outside of the confinement region may cause the RF current to interact with the gas reactant to ignite a plasma. Unlike the prior art, an RF ground return arrangement is provided that substantially eliminates the generation of plasma outside of confined chamber volume 310.

In an embodiment, a RF gasket 350 (see FIG. 3B) may be employed to create a RF contact between set of confinement rings 312 and lower electrode support structure 328 (such as a ground ring or another structure electrically connected to RF source 322). RF gasket 350, in an embodiment is made from a conductive material, such as stainless steel and beryllium copper, for example. Although RF gasket 350 is shown with a circular design, RF gasket 350 may have other configurations, such as a half-donut shape, a square shape, a rectangular shape, and the like. As can be appreciated from the foregoing, the shape of the RF gasket may vary based on manufacturer's preference as long as the RF gasket provides the required RF contact between set of confinement rings 312 and lower electrode support structure 328.

Unlike the prior art, RF gasket 350 creates a path 342 for the RF return current without creating a region outside of confined chamber volume 310 in which a magnetic field or a RF field may be formed. In other words, path 342 remains at the periphery of confined chamber volume 310 and effectively creates a Faraday shield around the plasma, thereby preventing plasma unconfinement. Thus, the RF ground return arrangement provides a short RF return path without encapsulating a region capable of sustaining plasma outside of confined chamber volume 310.

The RF ground return arrangement of FIGS. 3A and 3B may be implemented within a processing chamber with fixed lower electrode components. For a processing chamber that has movable lower electrode components, the RF ground return arrangement may be implemented as shown in FIGS. 4, 5, 6, and 7.

FIG. 4 shows, in an embodiment of the invention, a RF ground return arrangement for an adjustable-gap processing chamber 400. Similar to FIGS. 3A and 3B, a RF gasket 402 is employed to establish a RF contact between confinement ring 412 and a ground ring 428, which is part of a movable lower electrode support structure. In an embodiment, RF gasket 402 is made of a flexible conductive material, such as stainless steel. In an embodiment, RF gasket 402 may have a half donut shape (such as the upside-down C-shape shown in FIG. 4, a sideway C-shape RF gasket, or any other curved RF gasket design) that has a dimension large enough to provide a large curvature area such that when the lower electrode support structure is moved vertically, ground ring 428 still remains in RF contact with confinement ring 412. Similar to RF gasket 350 of FIG. 3, the shape of RF gasket 402 may vary based on manufacturer's preference as long as RF contact is maintained between ground ring 428 and confinement ring 412, thereby providing a short RF return path 442 while confining plasma within the confined chamber volume.

Figure 5:
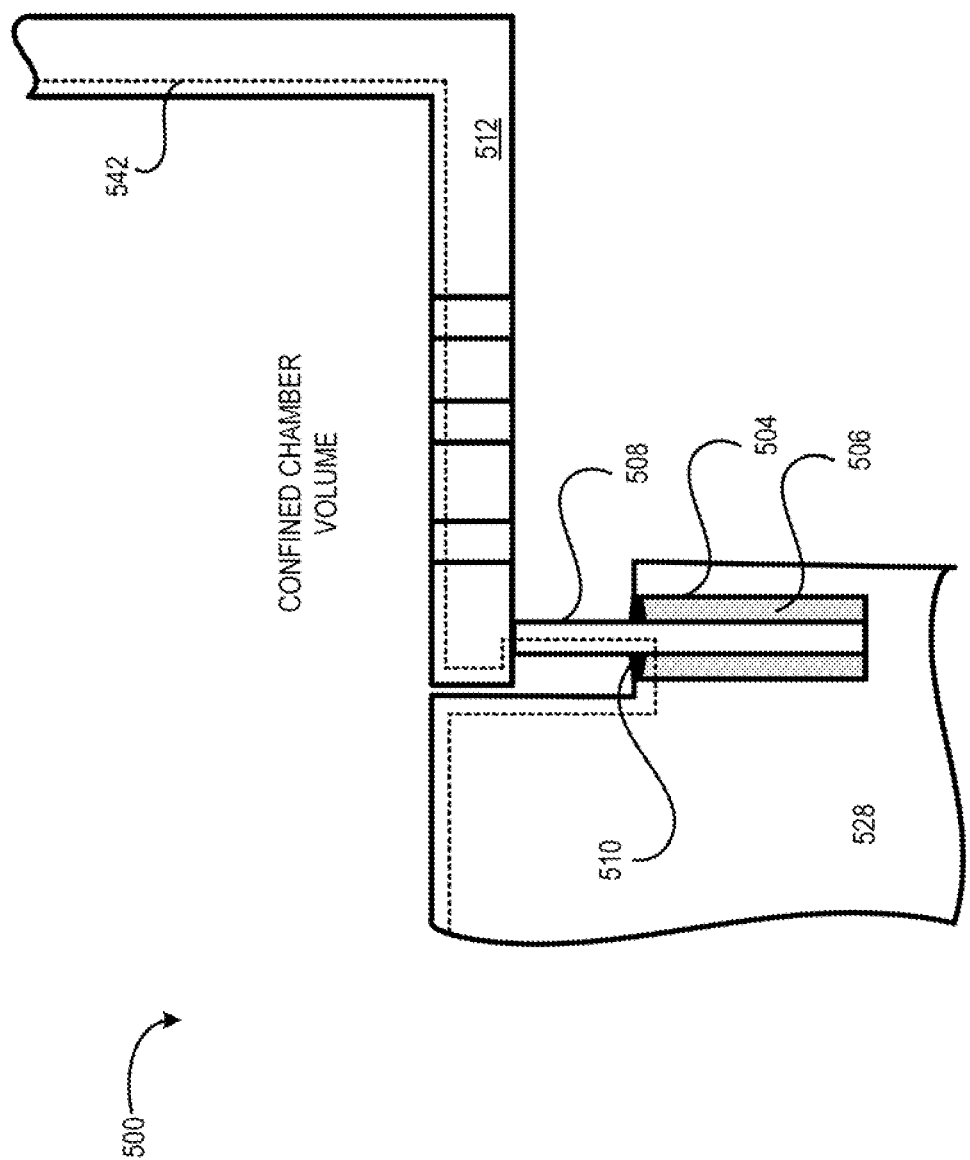

FIG. 5 shows in an embodiment of the invention, a simple partial diagram of an adjustable-gap processing chamber 500 with a RF ground return arrangement. In this configuration, the lower electrode support structure is movable. The lower electrode support structure may include a ground ring 528. Thus, as the lower electrode support structure moves up and down, ground ring 528 is also moving in the same direction.

In an embodiment ground ring 528 may include a recess 504 filled with a conductive liquid 506, such as mercury, for example. Disposed within conductive liquid 506 is a RF conductive rod 508, which is made from a conductive material such as aluminum, for example. In an embodiment, RF conductive rod 508 is configured at least to couple a confinement ring 512 to ground ring 528. In other words, a RF contact is established between confinement ring 512 and ground ring 528 via RF conductive rod 508. To minimize the potential of exposing conductive liquid 506 to the confined chamber volume, a gasket 510 (such as an o-ring) may be employed.

Thus, as the confined chamber volume is adjusted by moving the lower electrode support structure vertically, a part of RF conductive rod 508 continues to be disposed within conductive liquid 506, thereby maintaining the RF contact between confinement ring 512 and ground ring 528. As a result, a RF return path 542 is provided for the RF return current in which the path is significantly shorter than the prior art while substantially preventing a region to be established in the outside chamber volume capable of sustaining a plasma.

Figure 6:
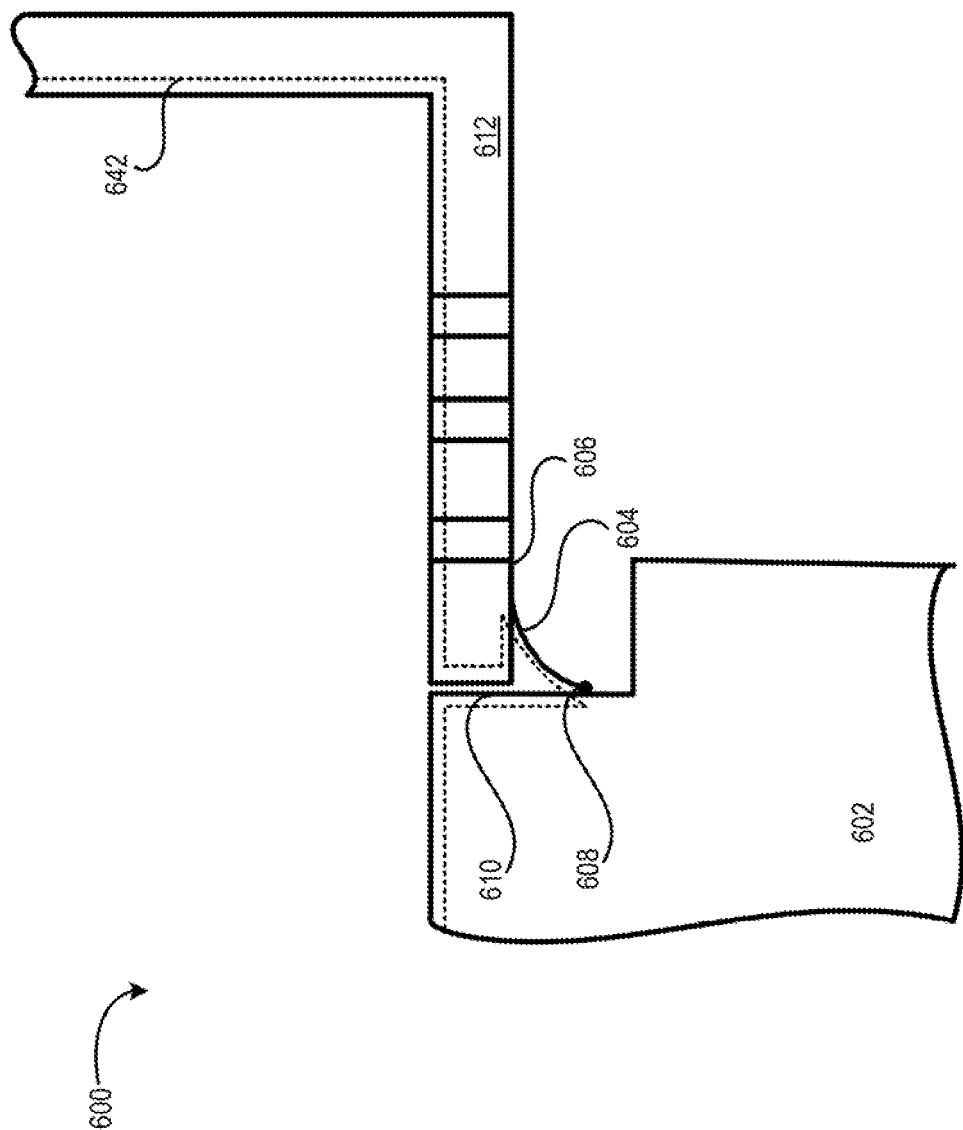

FIG. 6 shows, in an embodiment of the invention, another RF ground return arrangement for an adjustable-gap processing chamber 600. Similar to FIGS. 4 and 5, the lower electrode support structure is movable and may include a ground ring 602. Thus, as the lower electrode support structure moves vertically, ground ring 602 is also moving in the same direction.

In an embodiment of the invention, the RF ground return arrangement includes a spring-loaded sliding contact arrangement. In an embodiment, the spring-loaded sliding contact arrangement may be made from a conductive material, such as steel. The spring-loaded sliding contact arrangement may include a spring member 604. Spring member 604 may be a spring leaf, for example. Spring member 604 may be fixed to a confinement ring 612 at a fixed point 606. In an embodiment, spring member 604 may include a contact point 608, which is biased against a surface 610 of ground ring 602.

Thus, as the lower electrode support structure is moving vertically, ground ring 602 also moves up and down while maintaining RF contact with confinement ring 612. With the spring-loaded sliding contact arrangement, a short RF return path 642 is provided as the RF return current traverses along the inside of confinement ring 612 to ground ring 602 on its way back to the RF source.

Figure 7:
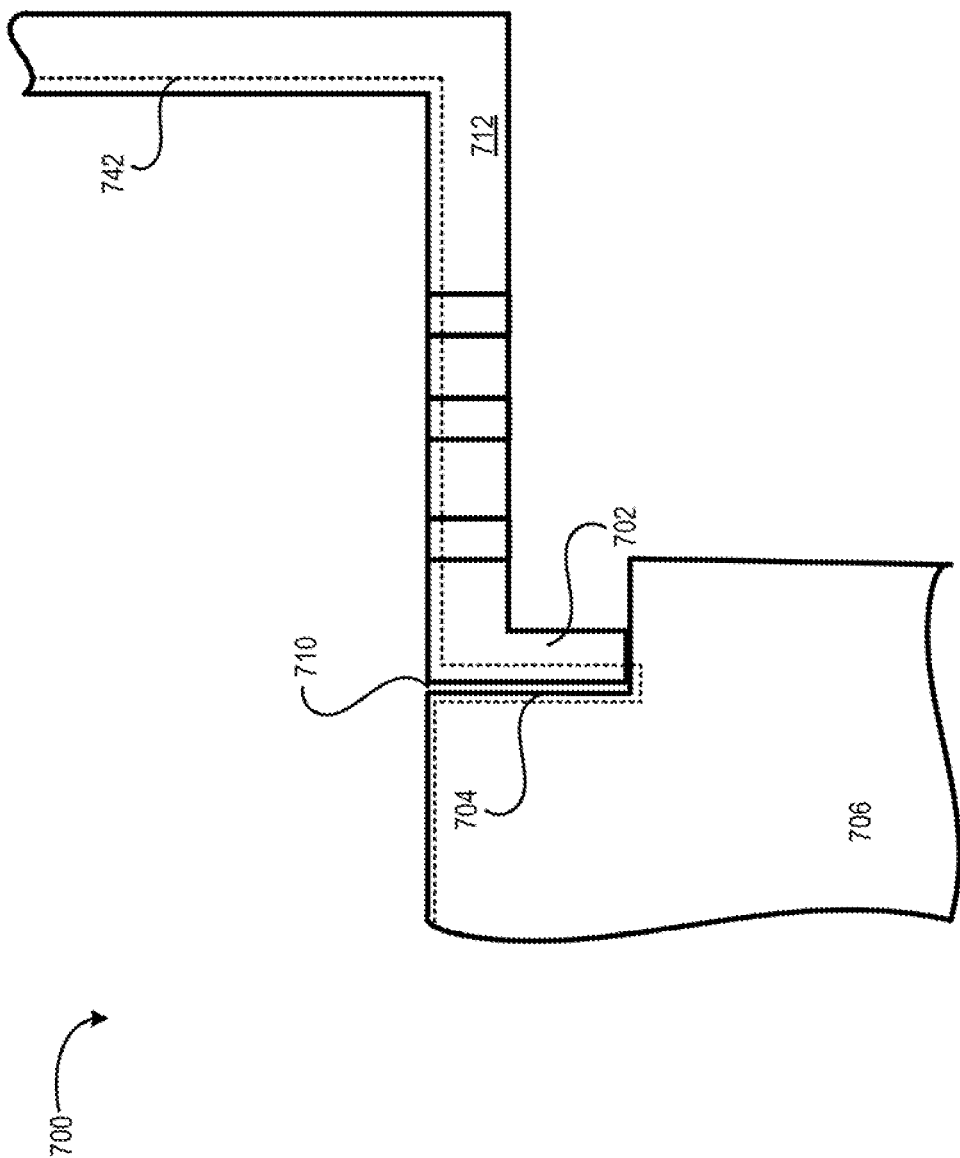

FIG. 7 shows, in an embodiment, another RF ground return arrangement for an adjustable-gap processing chamber 700. In an embodiment, a confinement ring 712 may include an extension 702. Extension 702 may be parallel to a side surface wall 704 of a ground ring 706, which is part of a movable lower electrode support structure.

Extension 702 is employed to create a large capacitance area between confinement ring 712 and ground ring 706. Those skilled in the art are aware that the capacitance is inversely related to the impedance. Thus, the higher the capacitance value, the lower is the impedance value.

To create a high capacitance area (such as one with a capacitance of 10 to 100 nanofarads, for example), extension 702 is positioned within close proximity to ground ring 706 since the capacitance of an area is directly proportional to the area and inversely proportional to the distance between extension 702 and ground ring 706. With a high capacitance, the gap (710) between extension 702 and ground 706 acts as a RF short and enables the RF return current to traverse from confinement ring 712 to ground ring 706. In other words, extension 702 and ground ring 706 creates a low impedance path. Since the RF return current tends to traverse the shortest path with the lowest impedance, the RF return path 742 as provided by extension 702 (via gap 710) is preferable over path 142 of prior art FIG. 1. Thus, a shorter RF return path is provided while plasma is confined within the confinement chamber volume.

As can be appreciated from the forgoing, one or more embodiments of the present invention provide for RF ground ring arrangements configured for establishing short RF return paths while substantially preventing an RF field from being established in the outside chamber volume of the processing chamber. By creating RF return paths with relatively low impedance, the RF return current is more likely to traverse back to the RF source using the more desirable RF return paths as provided by the RF ground return arrangements. With the RF return paths being kept away from the external region of the processing chamber, the possibility of igniting unconfined plasma outside of the confined chamber volume is substantially eliminated.

While this invention has been described in terms of several preferred embodiments, there are alterations, permutations, and equivalents, which fall within the scope of this invention. Although various examples are provided herein, it is intended that these examples be illustrative and not limiting with respect to the invention. In addition, even though the invention is described in relation to a capacitively-coupled plasma (CCP) processing system, the invention may also be applied in relation to an inductively-coupled plasma processing system or a hybrid plasma processing system.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. An apparatus for confining plasma within a plasma processing chamber is provided, the plasma processing chamber includes a lower electrode for supporting a substrate, a ground ring, and an upper electrode disposed over the lower electrode, the apparatus comprising,
a confinement ring, including,
a lower horizontal section extending between an inner lower radius and an outer radius of the confinement ring, the lower horizontal section includes an extension section that bends vertically downward at the inner lower radius, and the lower horizontal section further includes a plurality of slots;
an upper horizontal section extending between an inner upper radius and the outer radius of the confinement ring, the inner upper radius of the upper horizontal section is configured to surround a portion of the upper electrode and the upper horizontal section does not include slots and is positioned over the plurality of slots of the lower horizontal section; and
a vertical section that integrally connects the lower horizontal section with the upper horizontal section;
wherein the extension section of the lower horizontal section is configured to surround the ground ring that is disposed around the lower electrode so that an inner facing surface of the extension section is positioned parallel and separated by a gap from the ground ring;
wherein the gap provides for a capacitance of 10 to 100 nanofarads (nF) between the extension section and the ground ring, and said capacitance acts to produce an RF short for RF return currents, when said confinement ring is installed in the plasma processing chamber.

2. The apparatus of claim 1, wherein the lower horizontal section, the upper horizontal section and the vertical section define a C-shaped structure that is configured to confine plasma during processing by the plasma processing chamber.

3. The apparatus of claim 1, wherein the confinement ring defined by the lower horizontal section, the upper horizontal section and the vertical section is a continuous structure made from one of silicon, or polysilicon, or silicon carbide, or boron carbide, or ceramic, or aluminum.

4. The apparatus of claim 1, wherein the lower horizontal section, the upper horizontal section and the vertical section form part of a confined chamber volume that is radially outside of a chamber volume defined between the lower electrode and upper electrode.

5. The apparatus of claim 1, wherein the extension section that bends vertically downward at the inner lower radius of the lower horizontal section is at a 90 degree angle relative to the lower horizontal section.

6. The apparatus of claim 5, wherein the extension section is defined integral with the lower horizontal section, the vertical section and the upper horizontal section.

7. The apparatus of claim 6, wherein the extension section extends below a lower surface of the lower horizontal section.

8. The apparatus of claim 7, wherein the vertical section has a thickness that is greater than a thickness of the lower horizontal section.

9. The apparatus of claim 7, wherein each of the plurality of slots is disposed in the lower horizontal section in a region that is inside and between the inner lower radius and the outer radius of the confinement ring.

10. The apparatus of claim 9, wherein each of the plurality of slots is configured to define a path for gases out of a confined volume formed by the confinement ring, when the plasma processing chamber is in operation.

11. The apparatus of claim 1, wherein the vertical section separates the lower horizontal section and the upper horizontal section by a separation distance that substantially a equal to a separation distance between the lower electrode and upper electrode of the plasma processing chamber, when the confinement structure is installed in the plasma processing chamber.

12. The apparatus of claim 1, wherein an outer surface of the lower horizontal section, the vertical section and the upper horizontal section define an exterior region relative to a confined chamber volume that is facilitated by the confinement ring.

13. An apparatus for confining plasma within a plasma processing chamber is provided, the plasma processing chamber includes a lower electrode and, a ground ring, an upper electrode disposed over the lower electrode, the apparatus comprising,
a confinement ring having a C-shape where an open part of the C-shape faces toward a center of the confinement ring, the C-shape is defined by,
a lower horizontal section extending between an inner lower radius and an outer radius of the confinement ring, the lower horizontal section includes an extension section that is oriented downward at the inner lower radius, and the lower horizontal section further includes a plurality of slots;
an upper horizontal section extending between an inner upper radius and the outer radius of the confinement ring, the inner upper radius of the upper horizontal section is configured to surround a portion of the upper electrode and said upper horizontal section does not include slots and is positioned over the plurality of slots of the lower horizontal section; and
a vertical section that integrally connects the lower horizontal section with the upper horizontal section to complete the C-shape;
wherein the extension section of the lower horizontal section is configured to surround the ground ring that is disposed around a region of the lower electrode so that an inner facing surface of the extension section is positioned parallel and separated by a gap from the ground ring, wherein the gap provides for a capacitance of 10 to 100 nanofarades (nF) between the extension section and the ground ring, and said capacitance acts to produce an RF short for RF return currents when said confinement ring is installed in the plasma processing chamber.

14. The apparatus of claim 13, wherein the C-shape of the confinement ring is configured to confine plasma during processing by the plasma processing chamber.

15. The apparatus of claim 13, wherein the confinement ring defined by the lower horizontal section, the upper horizontal section and the vertical section is a continuous structure made from one of silicon, or polysilicon, or silicon carbide, or boron carbide, or ceramic, or aluminum.

16. The apparatus of claim 13, wherein the lower horizontal section, the upper horizontal section and the vertical section form part of a confined chamber volume that is radially outside of a chamber volume defined between the lower electrode and upper electrode, when said confinement ring is installed in said plasma processing chamber.

17. The apparatus of claim 13, wherein the extension section is at a 90 degree angle relative to the lower horizontal section.

18. The apparatus of claim 17, wherein the extension section is integral with the lower horizontal section, the vertical section and the upper horizontal section.

19. The apparatus of claim 18, wherein the extension section extends below a lower surface of the lower horizontal section.

20. The apparatus of claim 13, wherein each of the plurality of slots is disposed in the lower horizontal section in a region that is inside and between the inner lower radius and the outer radius of the confinement ring, and each of the plurality of slots is configured to define a path for gases out of a confined volume formed by the confinement ring, when the plasma processing chamber is in operation.

21. The apparatus of claim 13, wherein the vertical section separates the lower horizontal section and the upper horizontal section by a separation distance that substantially a equal to a separation distance between the lower electrode and upper electrode of the plasma processing chamber, when the confinement structure is installed in the plasma processing chamber.

22. The apparatus of claim 13, wherein an outer surface of the lower horizontal section, the vertical section and the upper horizontal section define an exterior region relative to a confined chamber volume that is facilitated by the confinement ring, when the confinement ring is installed in the plasma processing chamber.

* * * * *